United States Patent [19]

Lindsay

[11] Patent Number: 5,021,971

[45] Date of Patent: Jun. 4, 1991

[54] REFLECTIVE BINARY ENCODER FOR VECTOR QUANTIZATION

[75] Inventor: Robert A. Lindsay, Bountiful, Utah

[73] Assignee: Unisys Corporation, Blue Bell, Pa.

[21] Appl. No.: 447,314

[22] Filed: Dec. 7, 1989

[51] Int. Cl.[5] .................................................. G10L 5/00
[52] U.S. Cl. ................................. 364/513.5; 381/35;
381/40; 358/133; 358/135
[58] Field of Search ................. 381/35, 40; 364/513.5;
358/133, 135

[56] References Cited

U.S. PATENT DOCUMENTS 4,862,261 8/1989 Tanaka .......................... 358/135 X
4,907,276 3/1990 Aldersberg ........................... 381/35

Primary Examiner—Emanuel S. Kemeny
Attorney, Agent, or Firm—John B. Sowell; Mark T. Starr; Thomas J. Scott

[57] ABSTRACT

A binary encoder for vector quantization is provided which comprises a plurality of identical two-level branch selectors connected in a turnaround cascade pipeline array. The upper levels of the two-level selectors are connected in series and the first selector receives a formatted digital data vector input. The upper level of last selector has its output connected to its own lower level input and the outputs of the lower level selectors are connected in series so that the last lower level selector in the turnaround cascade resides in the first two level selector. The output of the last lower level selector provides a desired compressed data vector output.

12 Claims, 4 Drawing Sheets

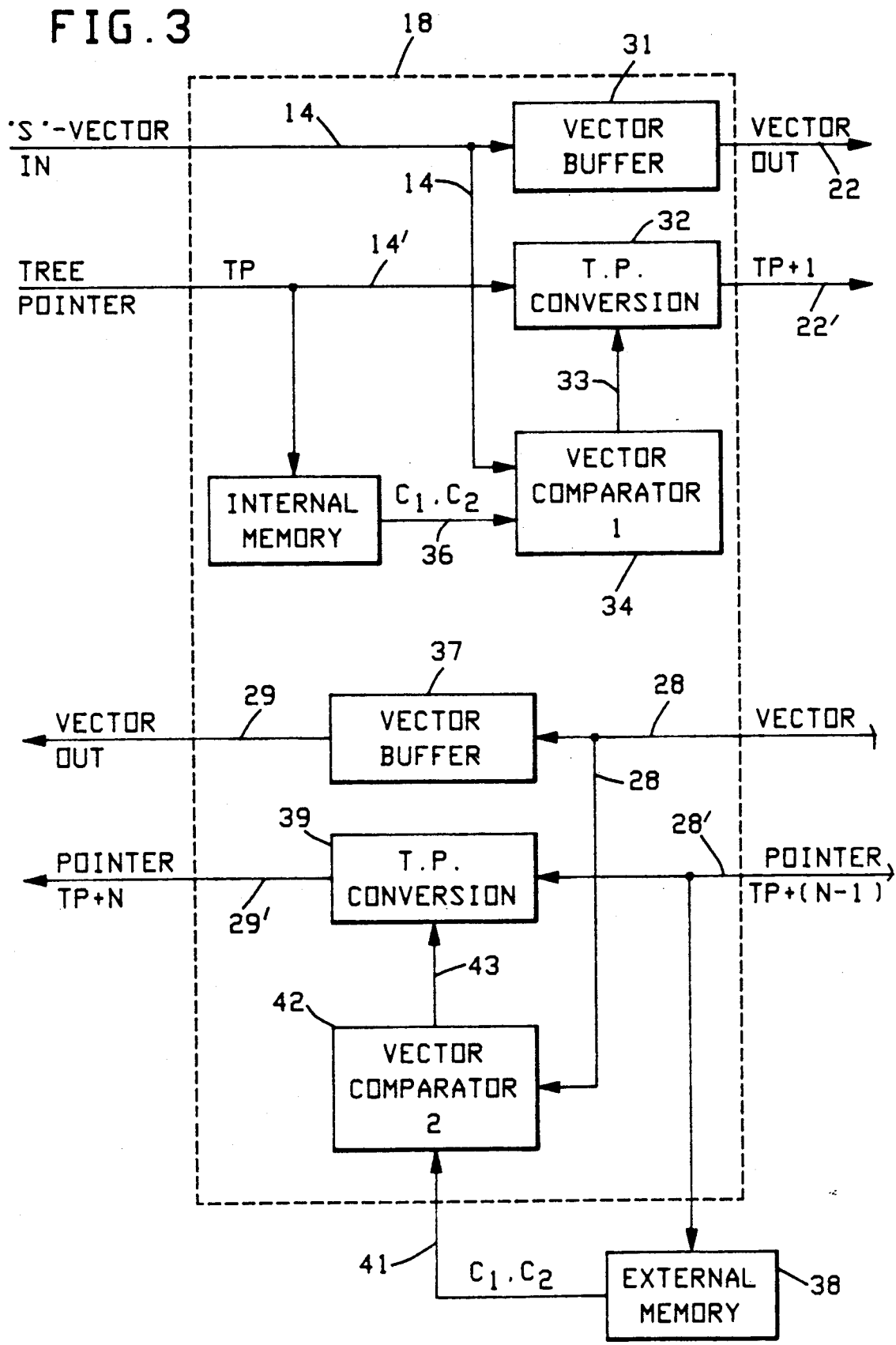

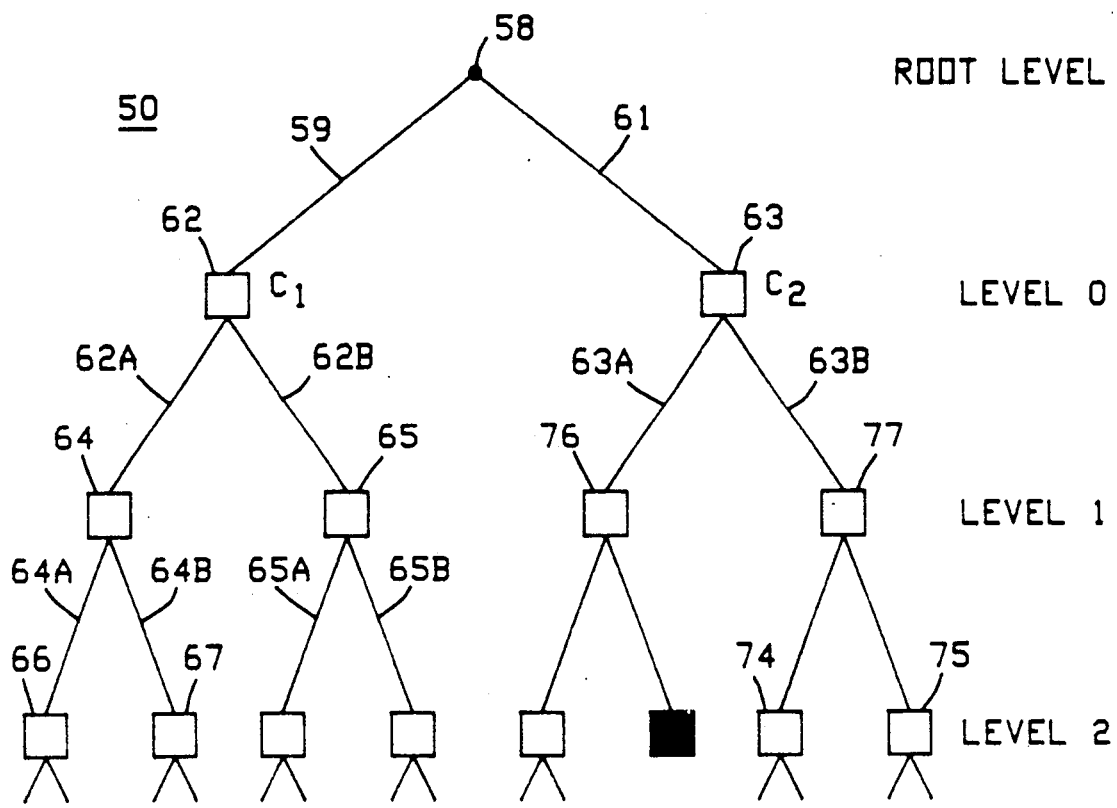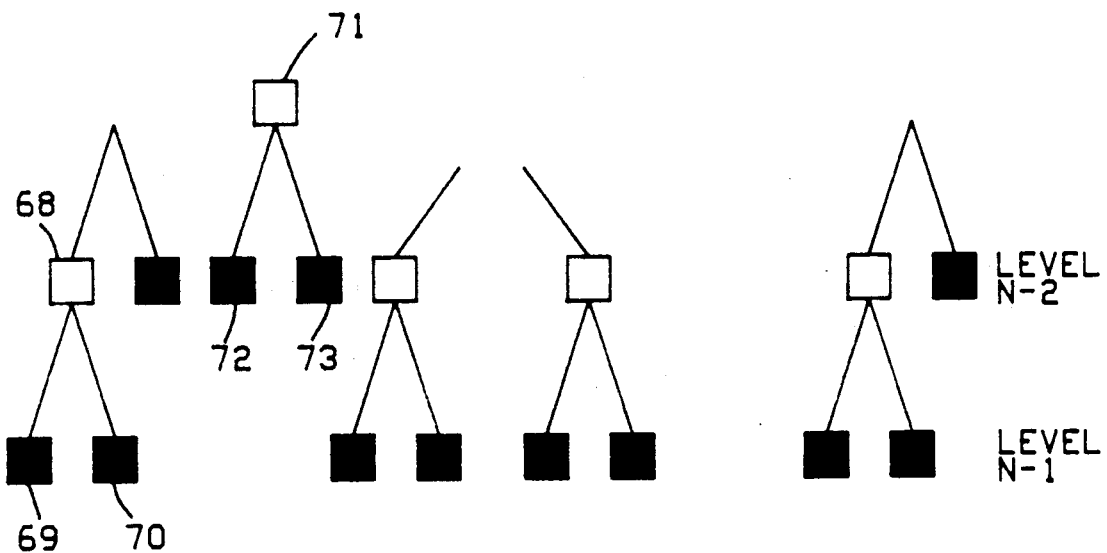
FIG.5

REFLECTIVE BINARY ENCODER FOR VECTOR QUANTIZATION

BACKGROUND OF THE INVENTION

1. Field of the Invention

This invention relates to a new reflective binary encoder for vector quantization. More particularly, the present invention relates to a vector quantization encoder and to a novel code book tree for use with vector quantization encoders to provide a non-uniform binary tree code book.

2. Description of the Prior Art

Vector quantizers are known and are described generally in the publications: "An Algorithm for Vector Quantizer Design" by Y. Linde, A. Buzo and R. Gray in IEEE Trans. on communications, Vol. Com-28, No. 1, Jan. 1980 and in "Vector Quantization in Speech Coding" by J. Makhoul, S. Roucos and H. Gish in Proceedings of the IEEE, Vol. 73, No. 11, Nov. 1985.

In my U.S. Pat. No. 4,727,354, there is disclosed a full search encoder for searching a random memory array but does not teach or suggest a reflective binary encoder or a non-uniform binary code tree book.

The article by Linde, Buzo and Gray, mentioned above, discloses an algorithm for designing a full search code book which has no code book tree structure to enhance search speed. This algorithm is widely known as the LBG algorithm.

The article by Makhoul, et al, mentioned above, discloses an algorithm for searching code books with embedded tree structures. A uniform and a non-uniform binary tree structure is disclosed.

It would be desirable to provide a new and improved encoder for vector quantization and associated therewith an improved non-uniform binary tree structure which enables faster encoding than the above-mentioned prior art structures.

SUMMARY OF THE INVENTION

It is a principal object of the present invention to provide a novel method for providing a new and improved non-uniform binary tree code book.

It is a primary object of the present invention to provide a novel code book structure which is an improvement over the prior art code book tree structures.

It is another principal object of the present invention to provide a reflective binary encoder having a new architecture.

It is a principal object of the present invention to provide a novel reflective binary encoder which employs a novel non-uniform binary tree code book.

It is a primary object of the present invention to provide a novel reflective binary encoder architecture which optimizes the use of commonly available logic and memory integrated circuit chip devices.

It is another principal object of the present invention to provide a novel reflective binary encoder architecture which is proven to provide a higher throughput rate than prior art structures.

It is another principal object of the present invention to provide a novel reflective binary encoder architecture constructed as an expandable cascade of identical chip devices.

It is a general object of the present invention to provide a novel two level branch selector which assists distribution of code book vectors so they may be searched in a cascaded pipeline structure.

It is another general object of the present invention to provide a novel selector structure which provides a best fit between computation complexity and memory access.

It is another general object of the present invention to provide a novel branch selector which employs an internal memory and an expandable external memory.

It is another general object of the present invention to provide a novel reflective binary encoder architecture which may be implemented by decreasing the number of branch selector chips to increase the data compression ratio.

According to these and other objects of the present invention, there is provided a new and improved encoder for vector quantization and associated improved non-uniform binary tree structure. The reflective binary encoder comprises a plurality of two level branch selectors arranged in a cascade or string, each of which computes two levels of a binary tree. The pipeline path through the cascade arranged two level branch selectors is arranged such that the sum of the two levels of the branch selector always equals the number of levels in the code book tree.

BRIEF DESCRIPTION OF THE DRAWINGS

FIG. 3 is a detailed block diagram of one of the novel modular two-level branch selectors shown in FIG. 2;

FIG. 5 is a schematic diagram of a non-uniform code book tree which may be pre-computed off-line using a general purpose processor.

DESCRIPTION OF THE PREFERRED EMBODIMENT

Figure 1:
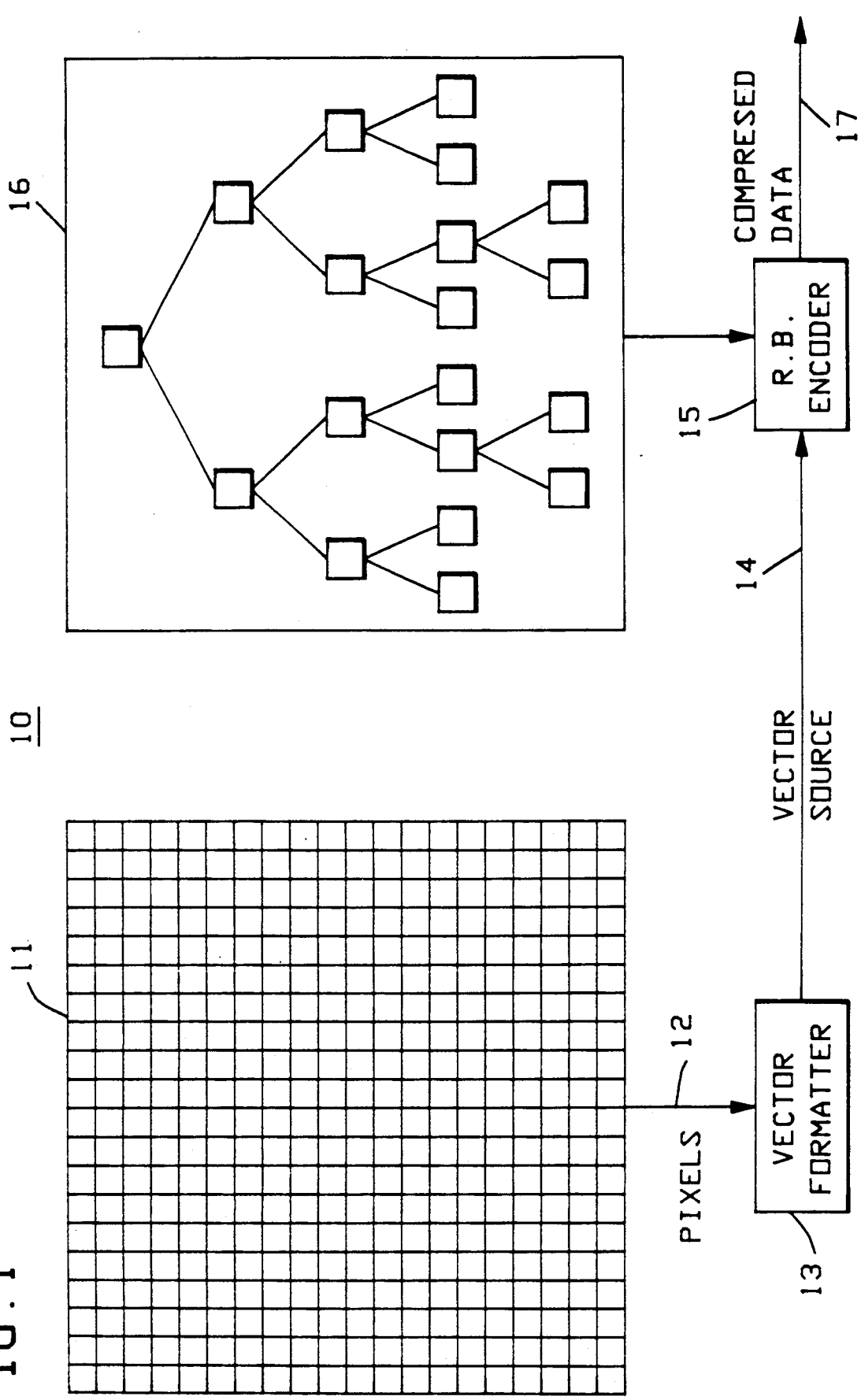
FIG. 1 is a schematic block diagram of an encoding system for encoding a source of digital information.

Refer now to FIG. 1 showing a schematic block diagram of an encoding system 10 having a digital pixel information source 11. Information describing each of the pixels in the array 11 are supplied on line 12 to a vector formatter 13. Depending on the type of digital information to be formatted, such as pixels from an imaging source, digitized speech information, synthetic aperture radar information, the sample vector source in digital form may be formatted by a vector formatter 13. Vector information on line 14 is applied to the novel reflective binary encoder 15, which will be explained in greater detail hereinafter. While shown as a separate element, the code book tree 16 is functionally a part of the reflective binary encoder 15. In the preferred embodiment of the present invention, the non-uniform binary code book tree is pre-computed by a general purpose processors which examines a plurality of typical vectors from the information source and computes candidate vectors for minimum distortion, preferably employing the LBG algorithm mentioned hereinbefore. In the present embodiment invention, reflected binary encoder, a code book tree 16 will always be generated in order to compress the desired digital data to produce the compressed data on output line 17.

Figure 2:
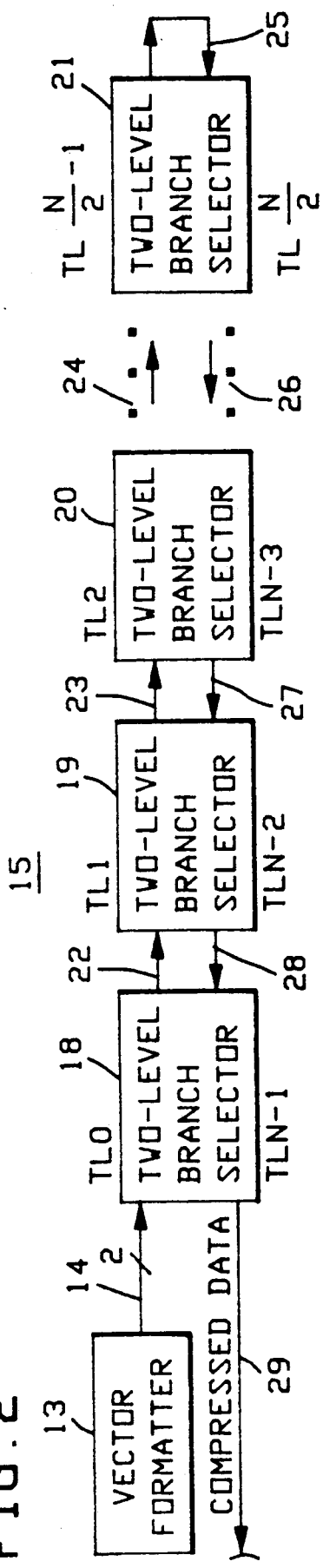
FIG. 2 is a simplified block diagram showing the novel modular two level branch structure selectors for a reflective binary encoder architecture.

Refer now to FIG. 2 showing a simplified block diagram of a novel reflective binary encoder architecture. The encoder 15 is shown comprising the input formatter 13 which produces the vectors on line 14 to the input of the reflective binary encoder 15 which comprises a plurality of two-level branch selectors 18-21. The input vector on line 14 enters the upper level of the two-level branch selector 18 and continues along the pipeline indicated by lines 22-25 and is reversed and returned through the lower level of the branch selectors 21 to 18 via a return pipeline indicated by lines 26-29. The line 29 for this illustration is the same as lines 17 of FIG. 1 on which the compressed data is provided. The levels of the individual selectors 18-21 have been indicated to be TL 0, TL 1, TL 2, and tree level TL $N/2-1$. In the return pipe line path, the lower branch of the selectors are shown numbered as TL $N/2$, TL $N-3$, TL $N-2$ and TL $N-1$ for the fourth and the last tree level of a tree having N levels.

Refer now to FIG. 3 showing a detailed block diagram of one of the novel modular two-level branch selectors 18-21. The vector on line 14 is shown entering a vector buffer 31 which holds the vector until the computation is complete and produces a vector output on line 22. The address pointer on tree pointer line 14' is initialized to zero by a controller or external processor (not shown). The tree pointer TP is applied to the TP conversion circuit 32 along with vector digital bit information on line 33 from the first vector comparator 34 to produce a new pointer for the next selector on line 22' shown as $TP+1$. The tree pointer on line 14' is applied to the internal memory 35 as an address to produce two vectors $C_1$ and $C_2$ on output line 36 which are applied to the first vector comparator 34 along with the vector on line 14. The vector $C_1$ and $C_2$ are compared with vector on line 14 to determine the single vector having the minimum distortion on line 33 to produce the vector digital bit information results on line 33 as mentioned before. As will be explained hereinafter, the single bit information on line 33 identifies the vector $C_1$ or $C_2$ having the minimum distortion from the input vector on line 14 which will enable the next stage selector to continue the search along the proper branch.

Branch selector 18 is shown having a return pipeline path which includes vector information on line 28 which is applied to vector buffer 37 during the minimum distortion calculation which occurs in the lower level of the two-level branch selector 18. The pointer for the external memory 38 is shown at line 28' as designated $TP+(N-1)$ and is also applied to the tree pointer conversion circuit 39 to produce the new pointer output $TP+N$ on line 29'. The purpose of the tree pointer conversion circuit 39 is to provide a mapping of the non-uniform binary tree structure to a linear array as required by memory 38. External memory 38 produces two new vectors $C_1$ and $C_2$ for the level of memory being searched which are coupled via line 41 to the second vector comparator 42 shown having a second vector input from vector input line 28. Vector comparator 42 determines the vector $C_1$ or $C_2$ having the minimum distortion from the vector on line 28 and produces an information bit on line 43 which is applied to the tree pointer conversion circuit 39 so as to identify the pointer $TP+N$ which identifies the desired compressed data. When the branch selector is not the first branch selector of the chain, the output vector on line 29 is passed on to the next branch selector in the pipeline sequence and the pointer on line 29 is coupled to another tree pointer conversion circuit and does not produce the final desired compressed data pointer $TP+N$, on line 29' as shown with selector 18.

For purposes of explaining how data compression is effected by a plurality of identical selectors 18, assume that each pixel shown in source 11 is defined by 8 bits. Assume further that a cluster of 16 pixels in a $4\times 4$ mini array define one input vector to be encoded. As each comparison is made in the codebook tree, one bit is added to the pointer which identifies or points at vectors at a node in the codebook tree 16. A tree pointer with one bit will define level 0, i.e. node 62 or 63 representative of a vector to be encoded as shown in FIG. 5. At level 1, there are four nodes or vectors which require address pointers. At level 2, eight address pointers are required and at level $N-1$, $2_N$ tree pointers are required.

To accommodate this need, the bits in the pointer are shifted right one bit as the pointer is generated at each successive level effectively creating a binary word where each bit order of the word defines the branch path to the next lower level of the codebook tree. Thus, twenty levels may be defined by twenty bits and the vector of $16\times 8$ bits is then identified by a twenty bit tree pointer. Fewer levels of compression require fewer tree pointer bits and the trade-off for greater data compression requires fewer levels in the code book tree at the expense of greater distortion.

Figure 4:
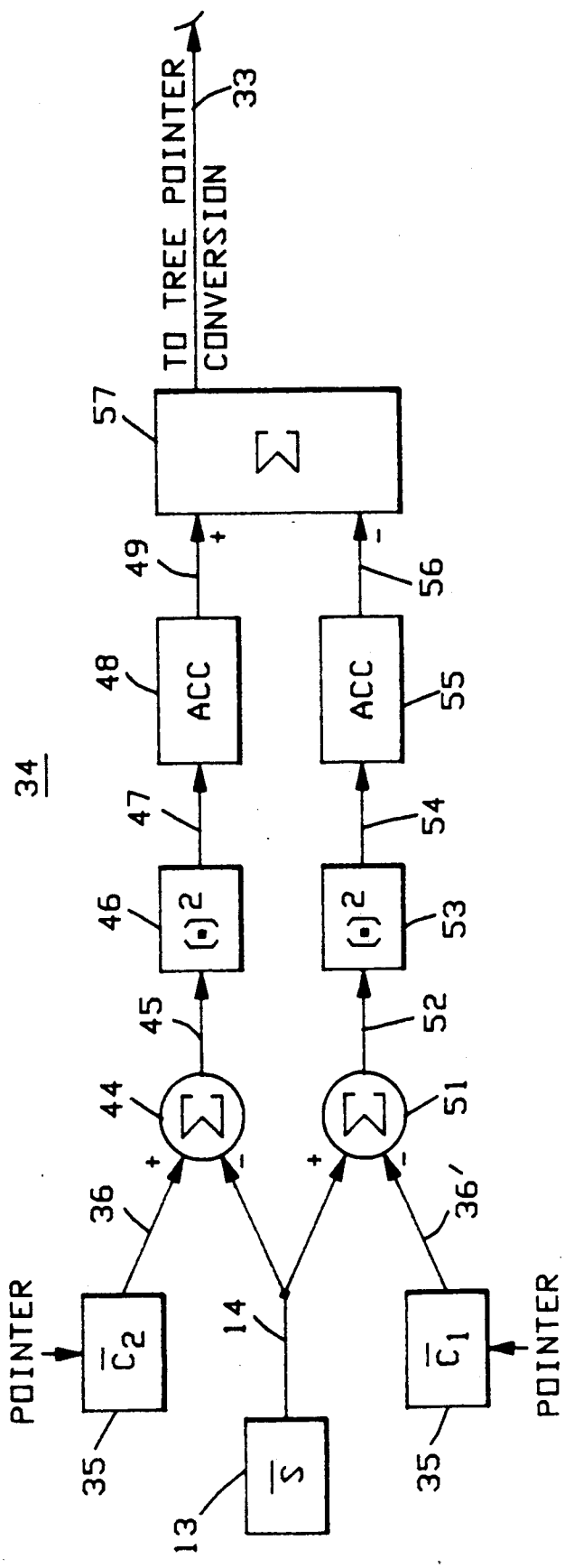
FIG. 4 is a detailed block diagram of a preferred embodiment vector comparator for use in the FIG. 2 encoder.

Refer now to FIG. 4 showing a more detailed block diagram of a preferred embodiment vector comparator 34 of the type shown in FIG. 3. The comparator 34 is a preferred embodiment comparator which computes the mean square error between the input vector on line 14 and the code book vectors $C_1$ and $C_2$ on line 36 and 36'. For purposes of simplifying the illustration, the source of the $C_1$ and $C_2$ vectors are shown in blocks 35 and the source of vectors from vector formatter 13 are shown in block 13. Components of the vectors S and $C_2$ on lines 14 and 36 are applied to a differential summing circuit 44 to provide an error signal or value on line 45 which is squared in square law circuitry 46 to produce a squared error signal on line 47 to accumulator 48 to provide an accumulated value on line 49. In similar manner, components of the vectors S and $C_1$ on lines 14 and 36' are applied to a differential summing circuit 51 to produce an error signal or value output on line 52 which is applied to the square law circuitry 53. The output of square law circuit 53 on line 54 is applied to a second accumulator 55 to produce a second accumulated error signal on line 56. The accumulated error signals on lines 49 and 56 are applied to a differential summing circuit 57 to produce the desired vector bit identification information on line 33, as explained previously with reference to FIG. 3. Again, it will be noted, that the information on line 33 will be used to identify one of the limbs of a branch employed in the searching process when moving from one search level to another in the code book tree.

Refer now to FIG. 5 showing a binary search tree 50. The root or origin of the tree is shown at node 58 and is identified as the root level of the tree and no comparison is made at the root level. Limbs 59 and 61 of the first branch are shown connected to nodes 62 and 63. The initial tree pointer is pointing at a pair of nodes and for purposes of explanation assume that at level zero, the pointer on line 14' is pointing at a pair of nodes corresponding to vectors $C_1$ and $C_2$ in memory represented by the vectors on line 36, now shown as vectors 62 and 63. Now for purposes of explanation, assume that the vector $C_1$ represented by node 62 has the least minimum distortion and the tree pointer conversion circuit 32 now modifies the pointer to point at the nodes 64 and 65. Now, if node 64 has the least minimum distortion, the tree pointer conversion circuit in the next selector will point at one of the nodes 66 or 67 and the process continues down through the levels until it reaches the last level in the code book tree. Assume for purposes of illustration, that the node 68 is the node having the least minimum distortion after proceeding through the levels down to level $N-1$. Then, the search will stop at one of the nodes 69 or 70 which is known as a leaf because it has no output limb structure. However, it is possible that the search could have proceeded through node 71 to one of the leaves 72 or 73 at the level $N-2$ and the search is redundantly repeated at level $N-2$ where the leaf 72 or 73 is reselected as the vector of minimum distortion which will appear at the output of the data compressor on line 29 of FIG. 2 and on line 17 of FIG. 1.

A feature of the present invention permits the novel two level branch selectors to each be conducting searches at different levels in the same code book tree as long the search never overlaps the same level. For example, assume that the aforementioned search is at the level 1 where a comparison is being made between nodes 64 and 65. It is possible that a different vector search in the code book can be operational and active at level 2 between the nodes 74 and 75. It will be noted that the levels of search shown as levels 0 through level $N-1$ on FIGS. 2 and 5 are numbered the same so that the lower level search at level $N-1$ shown on FIG. 5 is being conducted in the selector 18 of FIG. 2. Similarly, if the code book tree is provided with 18 levels, zero to seventeen, the search at the 8th and 9th levels (total 17) is being conducted at the last selector 21. If the code book tree is provided with 24 levels, 0 to 23, the search at the 11th and 12th (total 23) level is being conducted at the selector 21. Thus, it will be understood that if the levels had started with the level 1 instead of level 0, they will end with the level N and the sum of the levels at each of the branches will equal the value $N+1$. The only reason for using a zero level is to better illustrate that the root level has no level of its own for purposes of searching the code book tree.

A feature of the present invention is to provide a method of pre-computing the non-uniform code book tree by selecting the node vectors for each of the limbs of the branches by looking ahead at the next tree level so that the pair of next level node vectors have minimum distortion relative to the over-all training sequence distortion. It will now be explained how a preferred embodiment method of building a non-uniform code book tree which compresses with the best possible selection of data compression vectors. First, it is necessary to provide a large number of vectors representative of the digital information source in order to build the code book tree. Out of the total vectors in the training sequence, the two vectors having the least minimum distortion are selected using the conventional LBG algorithm. In the tree shown in FIG. 5, this is represented by the vector $C_1$ and $C_2$ designated 62 and 63. Associated with vector 62 is a cluster of vectors from the training sequence that are closer to the vector 62 than to the vector 63 and a cluster of vectors are associated with vector 63 having the same associated qualities with vector 63. At this point, in building the novel code book tree, two pseudo branches 62A and 62B are generated for the node 62. We also produce similar pseudo branches 63A and 63B for node 63. We now select the pseudo branches 62A, 62B associated with node 62 or the pseudo branches 63A, 63B associated with the nodes 63 by determining which of the vectors at nodes 64, 65, 76 or 77 produces the least minimum distortion. The one branch 62A, 62B or 63A, 63B which has the least minimum distortion path is determined and both pseudo branches are added to the code book tree. This process is repeated at each subsequent growth of the tree. Thus, it will be understood that the nodes 64 and 65 have the least minimum distortion associated with the node 62. When the tree grows in the direction shown in FIG. 5, then the pseudo branches 64A, 64B and 65A, 65B are created when vectors 64 and 65 are added to the tree. At each growth of the code book tree, two pseudo nodes are made permanent nodes and four new pseudo nodes are created.

The total accumulated distortion is defined by the total distortion of the clusters at the leaves of the tree grown to the last point of growth of the code book tree. By looking at all of the pseudo nodes or leaves at each operation of building the code book tree, a determination can be made which of the pseudo nodes when added to the total code book tree minimize the total cumulative distortion represented by the leaves of the tree. It will be understood that the pseudo nodes or leaves which are not yet made permanent nodes, are the nodes employed to determine the total cumulative distortion. Thus, the total cumulative distortion is being changed at each growth of a branch of the code book tree. This proceeds continues until the implementer of the encoder achieves a desired trade-off between the compressed data rate and distortion. Further, it is also possible to impose a limitation on the code book tree not to grow beyond a predetermined number of levels. At the conclusion of the tree groWth process, all of the then unused pseudo node leaves or pseudo nodes are discarded leaving the desired non-uniform code book tree of a desired number of levels.

Having explained a preferred embodiment of the present invention reflective binary encoder in conjunction with a novel, non-uniform code book tree, it will be appreciated that the present invention data compression encoder permits the search of the non-uniform code book tree at very high speeds utilizing identical two-level branch selectors which permits accessing all levels of the code book tree simultaneously. Further, by providing a novel two-level branch selector, the entire encoder may be made from a plurality of identical two-level branch selectors. The novel two-level branch selector may be provided with on-chip memory or if additional memory is desired, the lower level selector of the two-level selector may utilize an external memory of commercially available chips of the size necessary to accommodate the size of the code book and the levels of search desired.

What is claimed is:

1. A reflective binary encoder for vector quantization of a source of formatted digital data, comprising:
   a plurality of identical two-level branch selectors connected in a cascade pipeline array,
   each of said branch selectors having an upper level selector and a lower level selector,
   each of said upper and said lower level selectors being provided with a pair of inputs and a pair of outputs which define an upper level pipeline and a lower level return pipeline, means connecting said pairs of outputs of said upper level selectors to corresponding pairs of inputs of ones of said upper level selectors in said pipeline array, means connecting said pair of outputs of said lower level selectors to corresponding pairs of inputs of ones of said lower level selectors in said return pipeline array, the pair of outputs of said last upper level selector being connected to the pair of inputs of its own lower level selector, one of the pair of inputs of said first upper level selector being connected to said source of formatted digital data and the other of said pair of inputs of said first upper level selector being connected to an initialization pointer source, and one of the pair of the outputs of said first lower level two branch selector providing a compressed data vector output.

2. A reflective binary encoder as set forth in claim 1 wherein said plurality of identical two-level branch selectors comprise a cascade of N/2 two-level branch selectors for an N level code book tree search.

3. A reflective binary encoder as set forth in claim 1 wherein said upper level pipeline comprises the cascade connection of upper level selectors numbered 1 through N/2 and wherein said lower level return pipeline comprises the return cascade connection of lower level selectors numbered N/2+1 wherein N is the number of levels in the code book search tree.

4. A reflective binary encoder as set forth in claim 3 wherein the upper level selector and its associated lower level selector sum to a total of N+1.

5. A reflective binary encoder as set forth in claim 3 wherein said plurality of identical two-level branch selectors comprise identical upper and lower level selectors of the same integrated circuit chip.

6. A reflective binary encoder as set forth in claim 3 wherein said upper level selector and said lower level selector are each provided with a vector comparator for comparing an input vector with a pair of code book vectors, said upper level selector having an on-chip memory for storing said code book vectors, and said lower level selector having an off-chip memory for storing said code book vectors.

7. A reflective binary encoder as set forth in claim 1 wherein each said associated upper and lower selectors of a two-level branch selector is provided with an associated memory containing code book vectors associated with the level of the code book tree being searched by the respective upper and lower selectors.

8. A reflective binary encoder as set forth in claim 7 wherein said code book tree comprises a pre-computed non-uniform tree.

9. A method of creating a non-uniform code book, comprising the steps of:

calculating a distortion value for each vector in a training sequence, calculating a total over-all distortion value for said vectors in said training sequence, creating a root node, creating a first look a head branch having two limbs, each leading to a node, said nodes being selected from said training sequence as having the least minimum distortion relative to the total over-all distortion, creating a second and a third look ahead branch, each having two limbs leading to a total of four pseudo nodes, comparing the pairs of pseudo nodes at each of the look ahead branches and selecting the pair of pseudo nodes having the least minimum distortion, adding the two pseudo nodes which provide the least minimum distortion to the code book tree, adding two look ahead branches, each having two limbs leading to a total of four new pseudo nodes to the two nodes added to the code book tree, repeating the comparing of all of the pairs of pseudo nodes at each of the look ahead branches to determine the look ahead branch having the pair of pseudo nodes with the least minimum distortion, and repeating the adding of two pseudo nodes to the code book tree which now have the minimum distortion until a desired predetermined contingency is reached.

10. A method as set forth in claim 8 wherein said predetermined contingency is a predetermined distortion level.

11. A method as set forth in claim 8 wherein said predetermined contingency is a desired data compression rate.

12. A method as set forth in claim 8 wherein said predetermined contingency is when a predetermined tree level of said code book is reached.

* * * * *